(12) United States Patent
Yoshida

(10) Patent No.: US 10,510,993 B1
(45) Date of Patent: Dec. 17, 2019

(54) PRODUCTION METHOD FOR EL DEVICE

(71) Applicant: Sharp Kabushiki Kaisha, Sakai, Osaka (JP)

(72) Inventor: Tokuo Yoshida, Sakai (JP)

(73) Assignee: Sharp Kabushiki Kaisha, Sakai (JP)

(*) Notice: Subject to any disclaimer, the term of this patent is extended or adjusted under 35 U.S.C. 154(b) by 0 days.

(21) Appl. No.: 16/064,022

(22) PCT Filed: Feb. 27, 2017

(86) PCT No.: PCT/JP2017/007405
§ 371 (c)(1),
(2) Date: Aug. 30, 2018

(87) PCT Pub. No.: WO2018/154766
PCT Pub. Date: Aug. 30, 2018

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3244* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2009/0061233 A1 | 3/2009 | Yaegashi |
| 2014/0145587 A1 | 5/2014 | Yoon |
| 2014/0346473 A1 | 11/2014 | Park et al. |
| 2017/0104178 A1* | 4/2017 | Okada ............... B32B 27/08 |
| 2017/0287984 A1 | 10/2017 | Koresawa |
| 2018/0019290 A1* | 1/2018 | Arai .................. C08G 73/10 |
| 2019/0211436 A1* | 7/2019 | Nishida ............. C23C 14/042 |
| 2019/0241716 A1* | 8/2019 | Komori ............. G03F 7/004 |

FOREIGN PATENT DOCUMENTS

| | | |
|---|---|---|
| JP | 2001-6875 A | 1/2001 |
| JP | 2009-54420 A | 3/2009 |
| JP | 2014-127392 A | 7/2014 |
| JP | 2015-194518 A | 11/2015 |
| JP | 2016-38556 A | 3/2016 |
| JP | 2016-68401 A | 5/2016 |
| WO | 2014/112558 A1 | 7/2014 |
| WO | 2015/145533 A1 | 10/2015 |
| WO | 2016/035296 A1 | 3/2016 |

OTHER PUBLICATIONS

Official Communication issued in International Patent Application No. PCT/JP2017/007405, dated Apr. 25, 2017.

* cited by examiner

*Primary Examiner* — Alexander G Ghyka

(74) *Attorney, Agent, or Firm* — Keating & Bennett, LLP

(57) ABSTRACT

The disclosure provides a production method for an EL device including a base material, a TFT layer, and an EL layer; the production method including: forming at least a portion of the base material from a first resin film obtained by curing a first solution applied and a second resin film obtained by curing a second solution applied, wherein a viscosity of the first solution is made higher than a viscosity of the second solution.

20 Claims, 11 Drawing Sheets

PRODUCTION METHOD FOR EL DEVICE

TECHNICAL FIELD

The disclosure relates to an electroluminescence element (EL) device including an EL element.

BACKGROUND ART

A method of forming a layered body containing a resin film (polyimide film) and an organic EL element on a glass substrate and then separating a support substrate from the layered body is described in Patent Document 1.

CITATION LIST

Patent Literature

Patent Document 1: JP 2015-194518 A (published on Nov. 5, 2015)"

SUMMARY

Technical Problem

To allow the resin film to function as a base material after the support substrate is separated from the layered body, the resin film is required to have a certain thickness. When the resin film is to be obtained by applying and curing a solution (containing a resin precursor), increasing the viscosity of the solution to achieve the required thickness diminishes the flattening effect. This leads to the risk that large concave-convex portions may be formed on the resin film surface due to air bubbles or foreign matter that may become immixed at the time of application.

Solution to Problem

The production method for an EL device according to one aspect of the disclosure is a production method for an EL device including a base material, a TFT layer, and an EL layer. The production method includes: forming at least a portion of the base material from a first resin film obtained by curing a first solution that is applied and a second resin film obtained by curing a second solution that is applied; wherein a viscosity of the first solution is made higher than a viscosity of the second solution.

Advantageous Effects of Invention

According to one aspect of the disclosure, concave-convex portions on the surface can be reduced by the flattening effect of the second resin film obtained from the second solution having a low viscosity while securing the thickness with the first resin film obtained from the first solution having a high viscosity.

DESCRIPTION OF EMBODIMENTS

Figure 1:
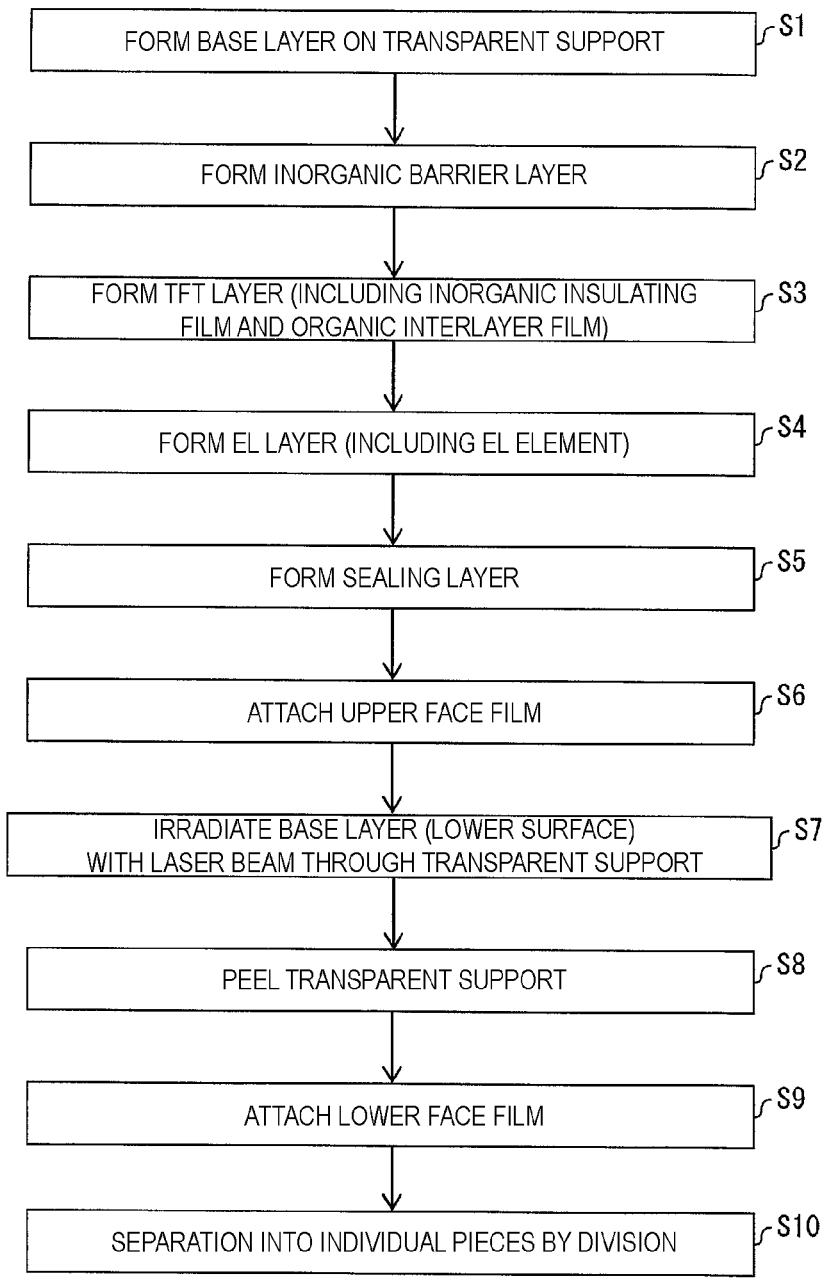
FIG. 1 is a flowchart illustrating an example of the production method for an EL device.
Figure 2A:
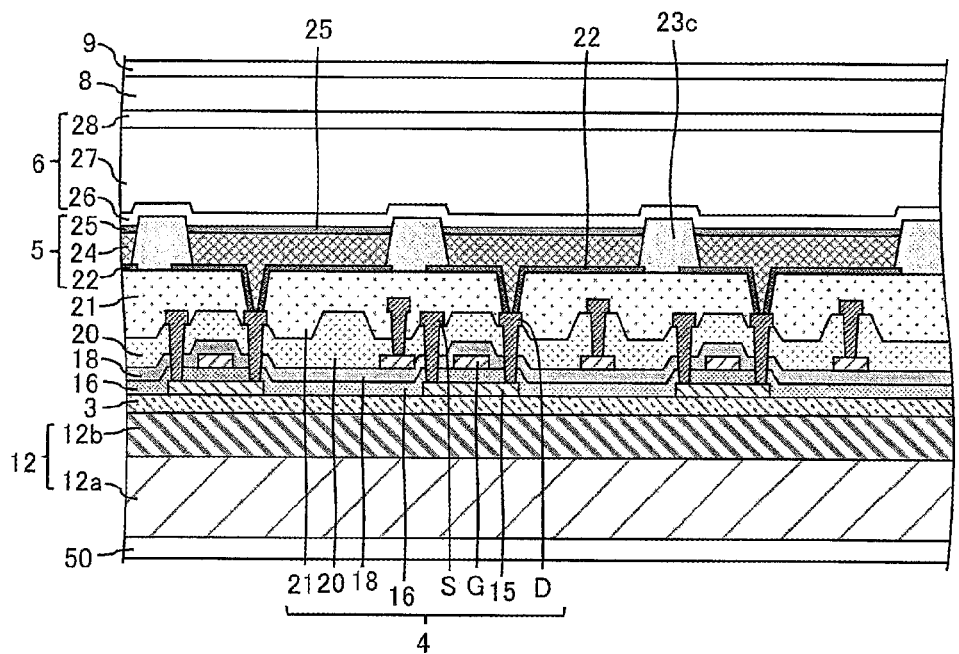
FIG. 2A is a cross-sectional view illustrating an example of the configuration of the EL device of a first embodiment during the formation of the EL device.
Figure 2B:
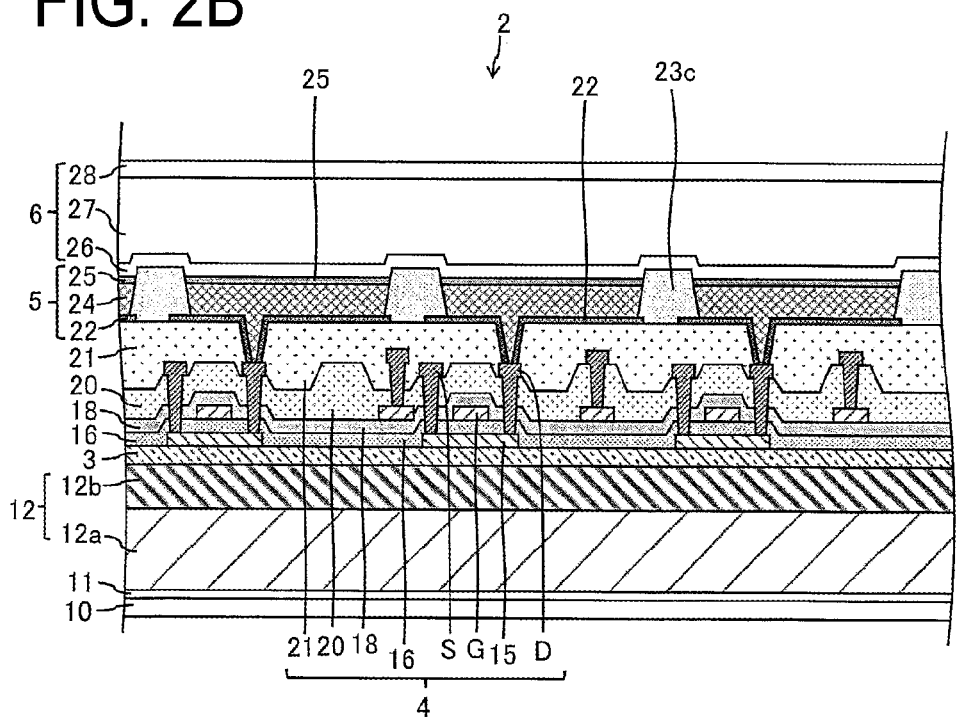
FIG. 2B is a cross-sectional view illustrating an example of the configuration of the EL device of the first embodiment.

FIG. 1 is a flowchart illustrating an example of the production method for an EL device. FIG. 2A is a cross-sectional view illustrating an example of the configuration of the EL device of a first embodiment during the formation of the EL device. FIG. 2B is a cross-sectional view illustrating an example of the configuration of the EL device of the first embodiment.

As illustrated in FIGS. 1 and 2A, a base layer 12 is first formed on a transparent support 50 (for example, a glass substrate) (step S1). Next, an inorganic barrier layer 3 is formed (step S2). Next, a TFT layer 4 including inorganic insulating films 16, 18, and 20 and an organic interlayer film 21 is formed (step S3). Next, an LED layer 5 including an EL element (for example, an organic light-emitting diode element) is formed (step S4). Next, a sealing layer 6 including a first inorganic sealing film 26 and a second inorganic sealing film 28 and an organic sealing film 27 is formed (step S5). Next, an upper face film 9 is attached to the sealing layer 6 via an adhesive layer 8 (step S6).

Next, the lower face of the base layer 12 is irradiated with a laser beam through the transparent support 50 (step S7). Here, the base layer 12 absorbs the laser beam which is irradiated onto the lower face of the transparent support 50 and passes through the transparent support 50. As a result, the lower face of the base layer 12 (interface with the transparent support 50) is altered by abrasion, and the bonding strength between the base layer 12 and the transparent support 50 decreases. Next, the transparent support 50 is peeled from the base layer 12 (step S8). Next, a lower face film 10 is attached to the lower face of the base layer 12 via an adhesion layer 11 (step S9). Next, the base layer 12 is partitioned together with the layered body on the base layer 12 to obtain the EL device 2 formed into an individual piece as illustrated in FIG. 2B (step S10). Note that each step is performed by a production apparatus for an EL device (described below).

The base layer 12 is a flexible layer which functions as a base material, and examples of the material thereof include polyimides, epoxies, and polyamides. The base layer 12 has a layered structure including a first resin film 12a and a second resin film 12b. The first resin film 12a on the lower face film 10 side has a thickness equal to or greater than that of the second resin film 12b (for example, a thickness three or more times greater than that of the second resin film 12b). The method for forming the base layer 12 (base material) is described in detail below.

The inorganic barrier layer 3 is a layer configured to prevent water or impurities from reaching the TFT layer 4 or the LED layer 5, and the barrier layer 3 may be made of a silicon oxide film, silicon nitride film, or silicon oxynitride film formed by CVD, or a layered film thereof, for example. The thickness of the inorganic barrier layer 3 is, for example, from 50 nm to 1500 nm.

The TFT layer 4 includes a semiconductor film 15, an inorganic insulating film 16 (gate insulating film) formed on the upper side of the semiconductor film 15, a gate electrode G formed on the upper side of the gate insulating film 16, inorganic insulating films 18 and 20 (passivation films) formed on the upper side of the gate electrode G, a source electrode S, drain electrode D, and terminal (not illustrated) formed on the upper side of the inorganic insulating film 20, and an organic interlayer film 21 formed on the upper side of the source electrode S and the drain electrode D. The semiconductor film 15, the inorganic insulating film 16, the gate electrode G, the inorganic insulating films 18 and 20, the source electrode S, and the drain electrode D constitute a thin film transistor (TFT). Note that a plurality of terminals for external connections are formed on the end of the TFT layer 4.

The semiconductor film 15 is made of a low-temperature polysilicon (LTPS) or an oxide semiconductor, for example. The gate insulating film 16 may be composed of a silicon oxide (SiOx) film or silicon nitride (SiNx) film formed by a CVD method, or a layered film thereof, for example. The gate electrode G, the source electrode S, the drain electrode D, and the terminals are composed of a single-layer film or a layered film of a metal including at least one of the group consisting of aluminum (Al), tungsten (W), molybdenum (Mo), tantalum (Ta), chromium (Cr), titanium (Ti), and copper (Cu). Note that in FIGS. 2A and 2B, the TFT using the semiconductor film 15 as a channel is illustrated as a top-gate structure, but the TFT may also have a bottom-gate structure (for example, when the channel of the TFT is an oxide semiconductor).

The inorganic insulating films 18 and 20 may be composed of a silicon oxide (SiOx) film or silicon nitride (SiNx) film formed by a CVD method, or a layered film thereof, for example. The organic interlayer film 21 may be made of a coatable photosensitive organic material such as polyimide or an acrylic. An anode electrode 22 is photoreflective and is formed by the layering of Indium Tin Oxide (ITO) and an alloy containing Ag.

The LED layer 5 (for example, an OLED layer) includes an anode electrode 22 formed on the upper side of the organic interlayer film 21, a partition 23c configured to define subpixels of the display region DC, a bank (not illustrated) formed in the non-display region, an EL (electroluminescence) layer 24 formed on the upper side of the anode electrode 22, and a cathode electrode 25 formed on the upper side of the EL layer 24.

The partition 23c and the bank may be formed in the same step, for example, using a coatable photosensitive organic material such as polyimide, epoxy, or acrylic. The bank of the non-display region is formed on the inorganic insulating film 20. The bank defines the edge of the organic sealing film 27.

The EL layer 24 is formed by vapor deposition or an ink-jet method in a region (subpixel region) enclosed by the partition 23c. When the EL layer 24 is an organic EL layer, the EL layer 24 is formed by laminating a hole injecting layer, a hole transport layer, a light emitting layer, an electron transport layer, and an electron injecting layer sequentially from the lower layer side, for example. The cathode electrode 25 may be made of a transparent metal such as Indium Tin Oxide (ITO) or Indium Zinc Oxide (IZO).

When the EL layer 24 is an organic EL layer, the holes and electrons are recombined in the EL layer 24 by a drive current between the anode electrode 22 and the cathode electrode 25, and the resulting excitons fall into a ground state, which causes light to be discharged.

Note that the EL layer 24 is not limited to the organic EL layer described above and may be an inorganic EL layer or a quantum dot EL layer.

The sealing layer 6 includes a first inorganic sealing film 26 configured to cover the partition 23c and the cathode electrode 25, an organic sealing film 27 configured to cover the first inorganic sealing film 26, and a second inorganic sealing film 28 configured to cover the organic sealing film 27.

The first inorganic sealing film 26 and the second inorganic sealing film 28 may each be composed of a silicon oxide film, silicon nitride film, or silicon oxynitride film formed by CVD, or a layered film thereof, for example. The organic sealing film 27 is a transparent organic insulating film which is thicker than the first inorganic sealing film 26 and the second inorganic sealing film 28 and may be made of a coatable photosensitive organic material such as a polyimide or an acrylic. For example, an ink containing such an organic material may be applied with an ink jet to the first inorganic sealing film 26 and then cured by UV irradiation. The sealing layer 6 covers the LED layer 5 and prevents the penetration of foreign matter such as water or oxygen into the LED layer 5.

Note that the upper face film 9 is attached to the sealing layer 6 via the adhesion layer 8 and functions as a supporting material when the transparent support 50 is peeled. An example of the material of the upper face film 9 is polyethylene terephthalate (PET).

The lower face film 10 is a film for producing an EL device with excellent flexibility by attaching the lower face film 10 to the lower face of the base film 12 after peeling the transparent support 50. An example of the material thereof is PET.

First Embodiment

Figure 3:
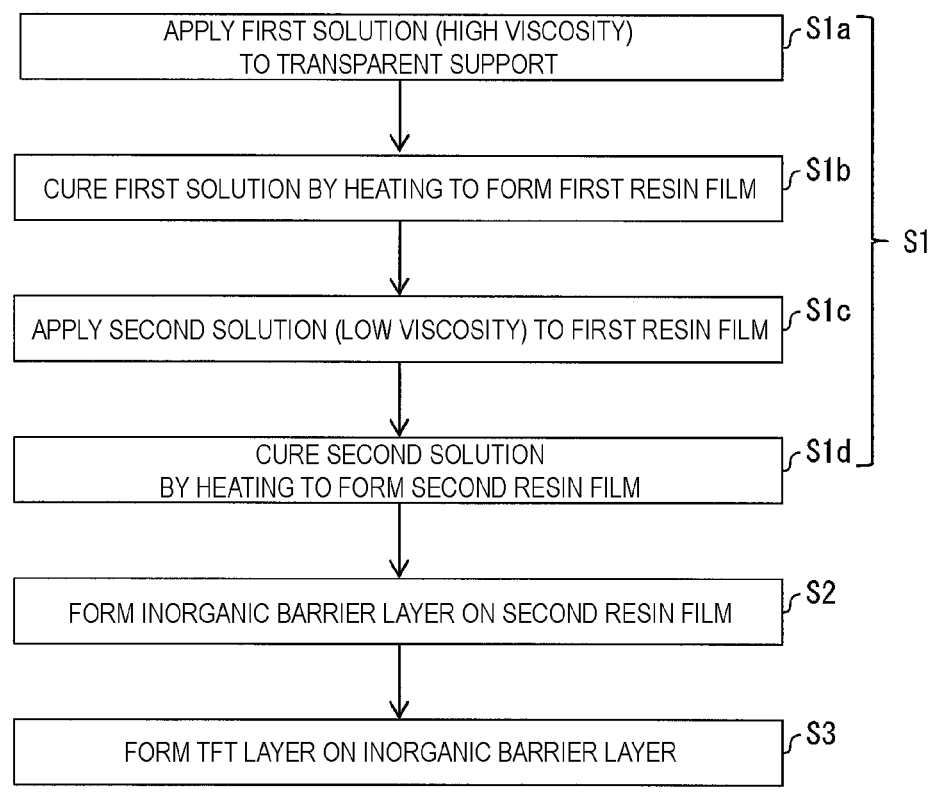
FIG. 3 is a flowchart illustrating an example of the formation of a base layer in the first embodiment.

FIG. 3 is a flowchart illustrating an example of the formation of a base layer in a first embodiment. FIGS. 4A to 4D are schematic diagrams illustrating the step of forming a first resin film in the first embodiment. FIGS. 5A to 5C are schematic diagrams illustrating the step of forming a second resin film in the first embodiment.

Figure 4A:
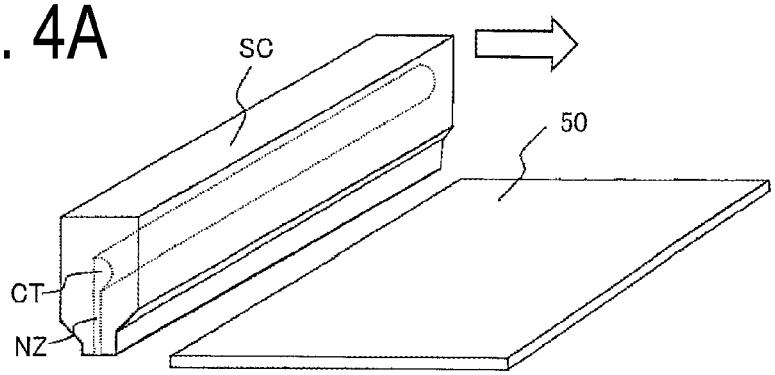
FIGS. 4A to 4D are schematic diagrams illustrating the step of forming a first resin film in the first embodiment.
Figure 4B:
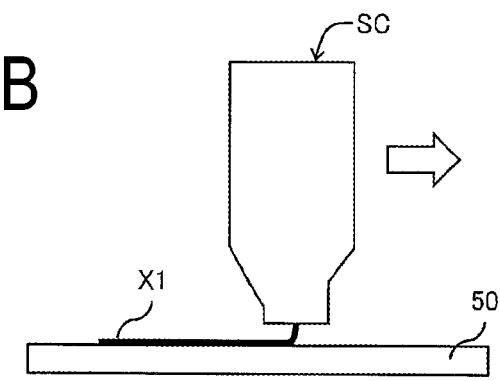
Figure 5A:
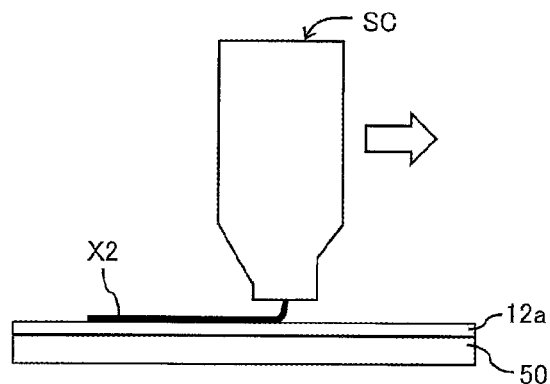
FIGS. 5A to 5C are schematic diagrams illustrating the step of forming a second resin film in the first embodiment.
Figure 5B:
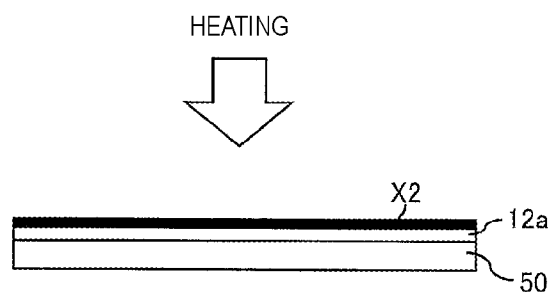
Figure 5C:
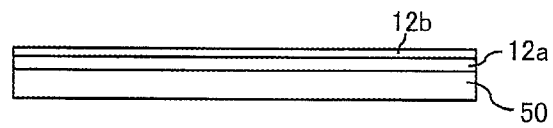

As illustrated in FIGS. 3, 4A, and 4B, a first solution X1 is applied to a transparent support 50 by using a slit coater SC (step S1a). The first solution X1 contains a resin precursor (for example, polyamic acid) and a solvent, and the viscosity thereof is from 1000 to 10000 (cp).

The slit coater SC discharges the first solution X1, with which the inside of a cavity CT is filled, from a groove-shaped nozzle NZ toward the transparent support 50. The tip of the nozzle NZ is separated from the surface of the transparent support 50 (for example, a glass substrate) by a prescribed distance. The first solution X1 is applied by moving the slit coater SC parallel to the surface of the transparent support 50. Note that the transparent support 50 may also be moved parallel to the slit coater SC.

Figure 4C:
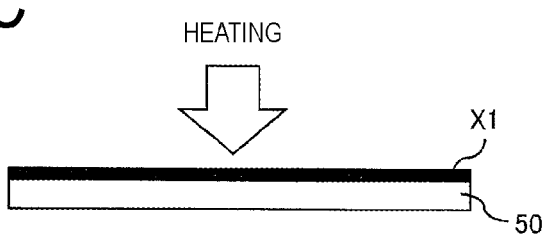
Figure 4D:
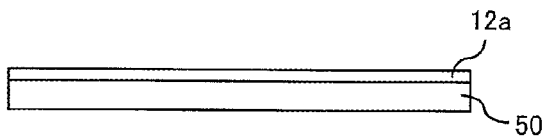

Next, as illustrated in FIGS. 3, 4C, and 4D, the first solution X1 applied to the transparent support 50 is cured by heating (for example, baked while held for one hour at 300 to 500 degrees) to form a first resin film 12a (for example, a polyimide film) (step S1b).

Next, as illustrated in FIGS. 3 and 5A, a second solution X2 is applied to the first resin film 12a by using the slit coater SC (step S1c). The second solution X2 contains a resin precursor (for example, polyamic acid) and a solvent, and the viscosity thereof is from 5 to 100 (cp).

Next, as illustrated in FIGS. 3 and 5C, the second solution X2 applied to the first resin film 12a is cured by heating (for example, baked while held for one hour at 300 to 500 degrees) to form a second resin film 12b (for example, a polyimide film) (step S1d).

Figure 6:
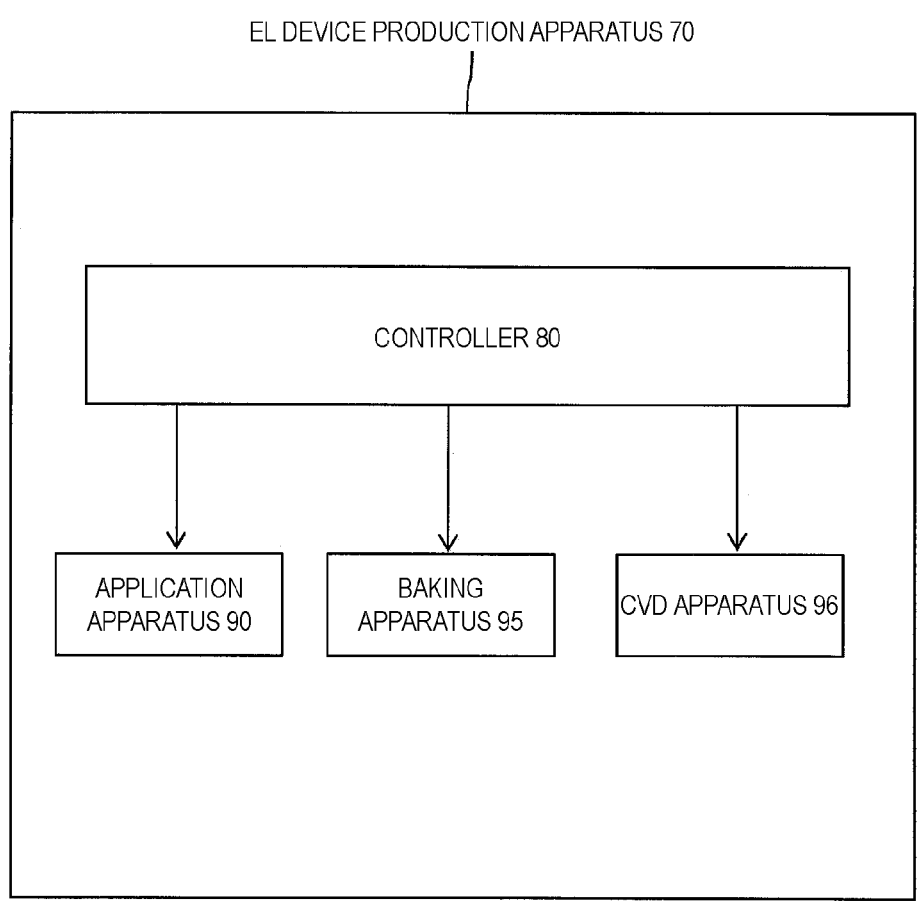
FIG. 6 is a block diagram illustrating an example of the configuration of an EL device production apparatus of the first embodiment.

As illustrated in FIG. 6, an EL device production apparatus 70 includes an application apparatus 90 including the slit coater SC illustrated in FIGS. 4 and 5, a baking apparatus 95, a CVD apparatus 96, and a controller 80 configured to control these apparatuses. The application apparatus 90 executes steps S1a to S1d of FIG. 3 under the control of the controller 80.

Figure 7:
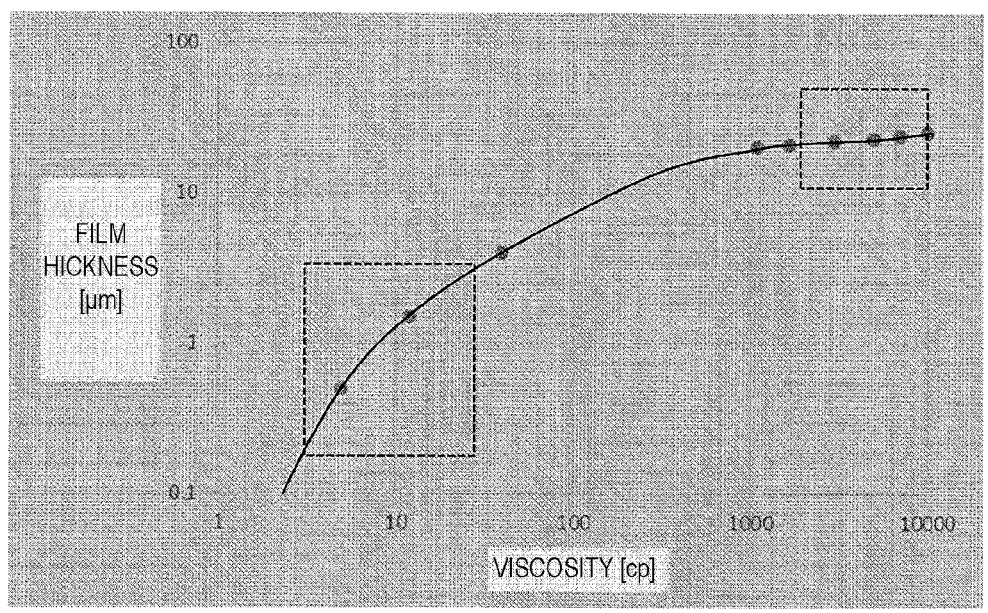
FIG. 7 is a graph showing the relationship between viscosity and resin film thickness.

FIG. 7 is a graph showing the relationship between the viscosity of the solution and the thickness of the resin film. A first resin film 12a (polyimide film) having a thickness of from 5 to 40 (μm) can be formed by setting the viscosity of the first solution X1 containing polyamic acid and a solvent to from 1000 to 10000 (cp). In addition, a second resin film 12b (polyimide film) having a thickness of from 0.5 to 5 (μm) can be formed by setting the viscosity of the second solution X2 containing polyamic acid and a solvent to from 5 to 50 (cp).

Note that because it is presumed that the function of the TFT layer may be affected when a level difference due to air bubbles or foreign matter exceeds 1 μm, the thickness of the second resin film 12b is preferably not less than 1 (μm) (not less than 10 cp in terms of the viscosity of the second solution X2). However, when the viscosity of the second solution X2 is increased, the filter size of the slit coater SC also becomes large, and foreign matter also becomes large. Therefore, the upper limit of the viscosity of the second solution X2 which allows the second resin film 12b to function as a flattening film is 100 (cp).

With the first embodiment, concave-convex portions on the surface of the second resin film 12b can be reduced by the flattening effect of the second resin film 12b obtained from the second solution X2 having a low viscosity while securing the thickness with the first resin film 12a obtained from the first solution X1 having a high viscosity. This prevents the barrier function of the inorganic barrier layer 3 from being diminished by concave-convex portions on the upper surface of the base layer 12, and prevents defects in the pattern formation of the TFT layer 4.

In addition, since the thick first resin film 12a obtained from the first solution X1 having a high viscosity has tensile stress prior to the peeling of the transparent support 50, the generation of curls or wrinkles can be suppressed by negating the compressive stress released from the inorganic barrier layer 3 and the TFT layer 4 (in particular, the inorganic films contained in these layers) when the transparent support 50 is peeled.

In the example described above, both the first resin film 12a and the second resin film 12b are made of polyimide films, but the disclosure is not limited to this case. The first resin film 12a and the second resin film 12b may also be formed from different resin films.

Second Embodiment

In step S1a of FIG. 3, as illustrated in FIG. 8, the application of the first solution X1 to the transparent support 50 can also be performed by the mixed application of a base solution Y having a lower viscosity than the first solution X1 and a thickener Z.

The slit coater SC of the second embodiment includes two cavities CTa and CTb and two nozzles NZa and NZb. The slit coater SC discharges the base solution Y, with which the inside of the cavity CTa is filled, from the groove-shaped nozzle NZa toward the transparent support 50 and discharges the thickener Z, with which the cavity CTb is filled, from the groove-shaped nozzle NZb toward the transparent support 50. Here, the base solution Y and the thickener Z discharged from the nozzles NZa and NZb are mixed together prior to or at roughly the same time as the base solution Y and the thickener Z come into contact with the transparent support 50, resulting in a first solution X1 having a high viscosity.

With the second embodiment, the base solution Y with which the inside of the cavity CTa is filled has a lower viscosity than the first solution X1. Thus, there is hardly the possibility that the base solution Y may contain air bubbles. In addition, since the mesh size can also be made small, foreign matter which may be mixed into the first solution X1 also becomes small. Further, by preparing the base solution Y with the same material as the second solution X2, the same slit coater SC can be used to form the first resin film 12a and the second resin film 12b without replacing the solution inside the cavity CTa.

Figure 8A:
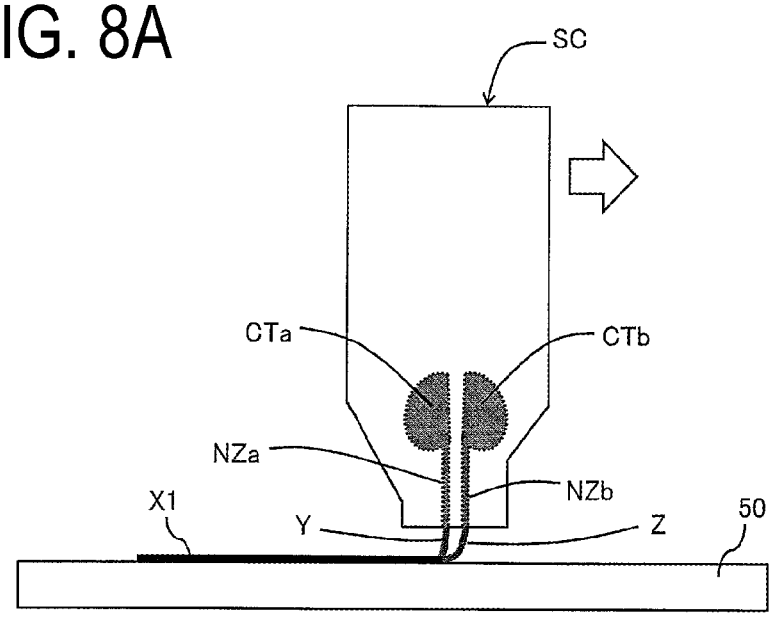
FIGS. 8A and 8B are schematic diagrams illustrating the step for forming a first resin film in a second embodiment.
Figure 8B:
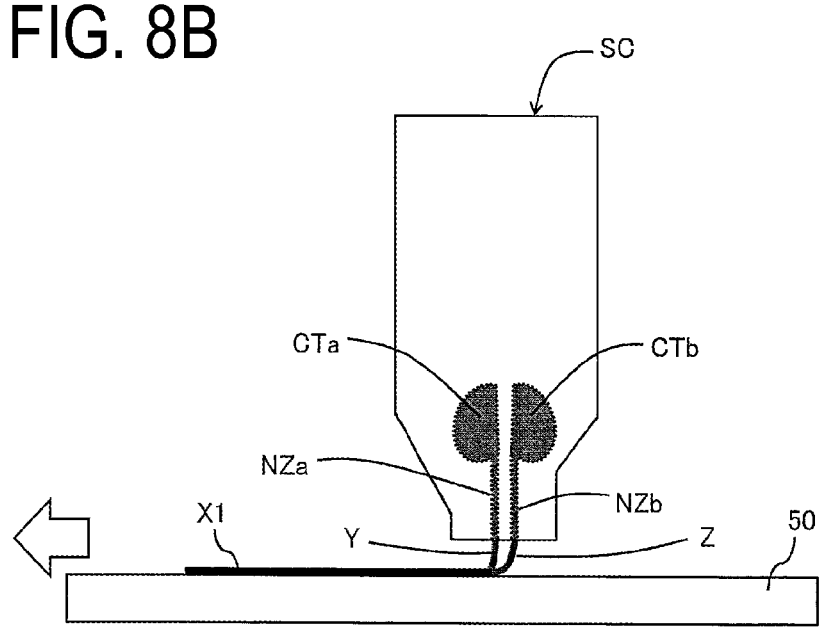

In FIG. 8A, the nozzle NZb configured to discharge the thickener Z is disposed in front with respect to the advancing direction, and the nozzle NZa configured to discharge the base solution Y is disposed in back with respect to the advancing direction. However, this is merely one example, and the nozzle NZa configured to discharge the base solution Y may also be disposed in front with respect to the advancing direction, while the nozzle NZb configured to discharge the thickener Z may be disposed in back with respect to the advancing direction. Note that, as illustrated in FIG. 8B, the transparent support 50 may be moved without moving the slit coater SC.

Third Embodiment

Figure 9A:
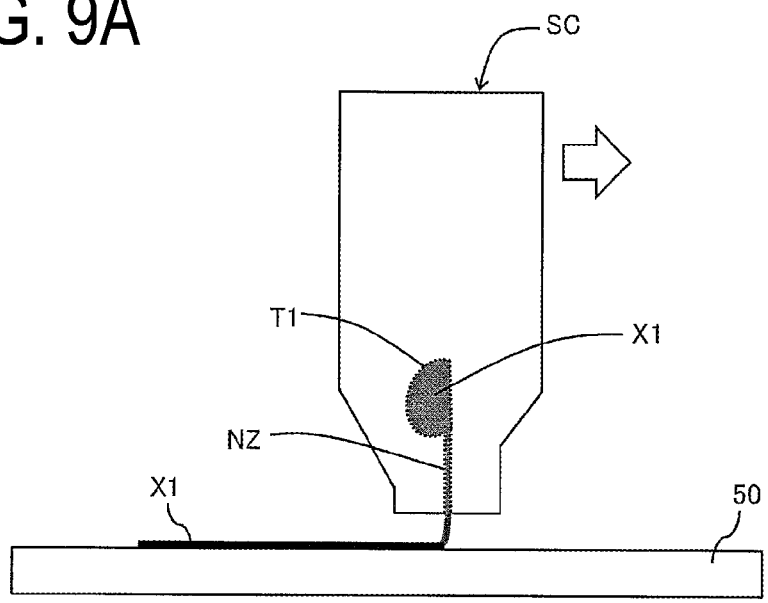
FIGS. 9A and 9B are schematic diagrams illustrating the step of forming first and second resin films in a third embodiment.
Figure 9B:
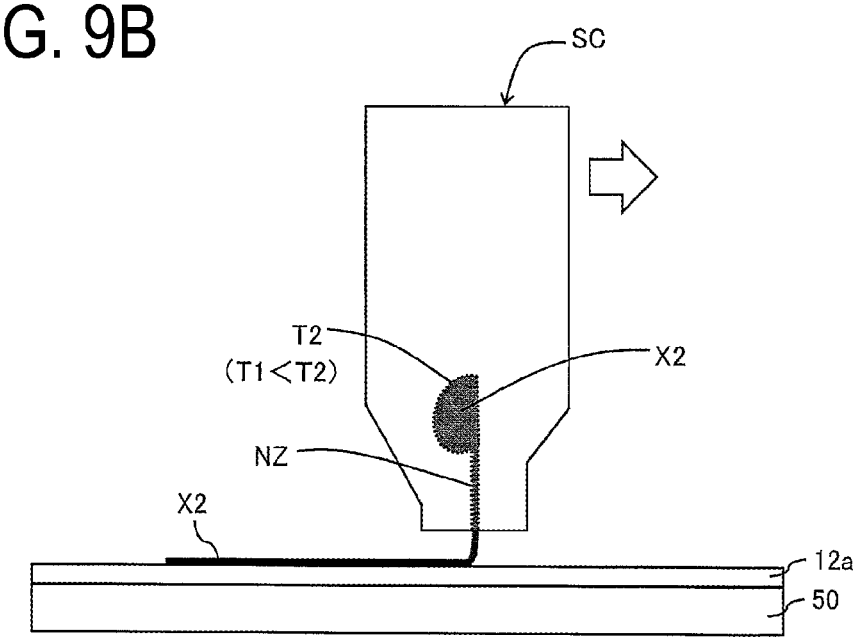

In step S1a of FIG. 3, the first solution X1 may be given a high viscosity by setting the temperature inside the cavity of the slit coater SC to T1 (low temperature), as illustrated in FIG. 9A. In step S1c of FIG. 3, the second solution X2 may be given a low viscosity by setting the temperature inside the cavity of the slit coater SC to T2 (high temperature, T2>T1) as illustrated in FIG. 9B.

In the third embodiment, by using the same types of solutions which change in viscosity with temperature as the first solution X1 and the second solution X2, the same slit coater SC can be used to form the first resin film 12a and the second resin film 12b without replacing the solution inside the cavity.

Fourth Embodiment

Figure 10:
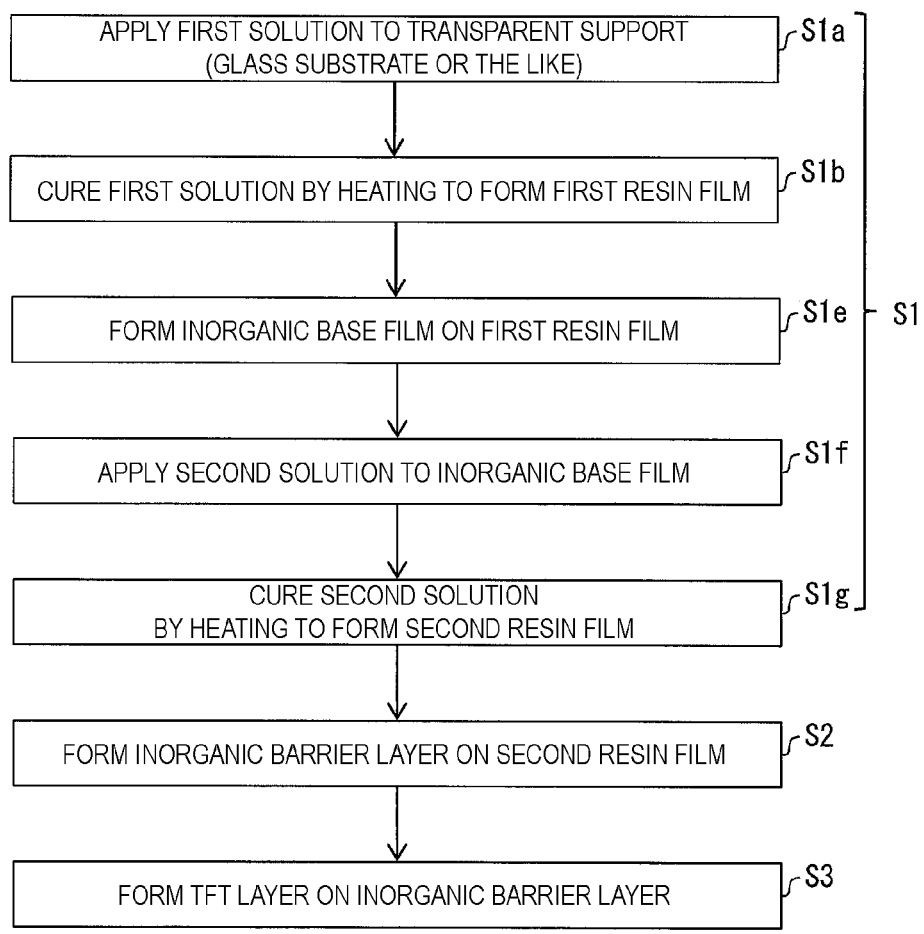
FIG. 10 is a flowchart illustrating an example of the formation of a base layer in a fourth embodiment.
Figure 11:
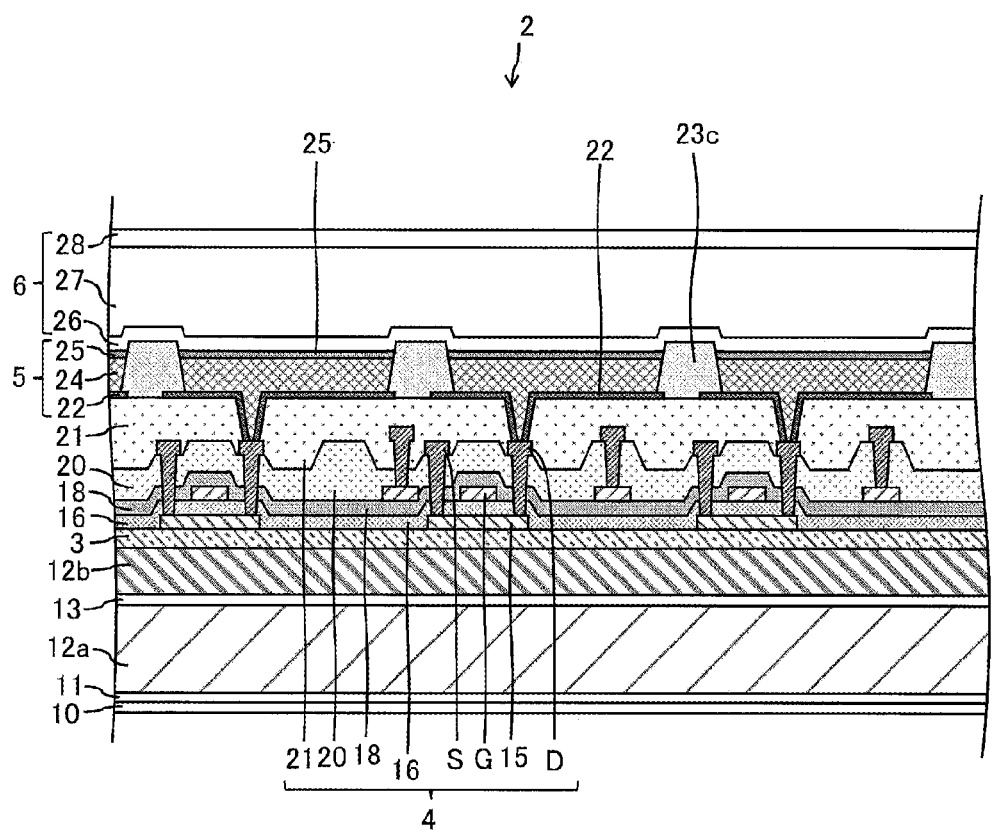
FIG. 11 is a cross-sectional view illustrating an example of the configuration of the EL device of the fourth embodiment.

FIG. 10 is a flowchart illustrating an example of the formation of a base layer in a fourth embodiment. FIG. 11 is a cross-sectional view illustrating an example of the configuration of the EL device of the fourth embodiment.

In the fourth embodiment, as illustrated in FIGS. 10 and 11, an inorganic base film 13 may be formed on the first resin film 12a, and the second resin film 12b may be formed on the inorganic base film 13. The inorganic base film 13 may be made of a silicon oxide film, silicon nitride film, or silicon oxynitride film formed by CVD, or a layered film thereof, for example. In this case as well, the first resin film 12a on the lower face film 10 side preferably has a thickness equal to or greater than the thickness of the second resin film 12b (for example, a thickness three or more times greater than the thickness of the second resin film 12b).

The base layer 12 can be given a barrier function by forming the base layer 12 with a layered structure including the first resin film 12a, the inorganic base film 13, and the second resin film 12b. In addition, the adhesion between the first resin film 12a and the inorganic base film 13 and the adhesion between the inorganic base film 13 and the second resin film 12b can also be enhanced.

Supplement

The production method for an EL device according to a first aspect is a production method for an EL device including a base material, a TFT layer, and an EL layer; the production method including: forming at least a portion of the base material from a first resin film obtained by curing a first solution applied and a second resin film obtained by curing a second solution applied, wherein a viscosity of the first solution is made higher than a viscosity of the second solution.

In a second aspect, the second solution is applied to the first resin film.

In a third aspect, an inorganic base film is formed on the first resin film, and the second solution is applied to the inorganic base film.

In a fourth aspect, the first resin film has a thickness equal to or greater than the thickness of the second resin film (for example, a thickness three or more times greater than the thickness of the second resin film).

In a fifth aspect, a viscosity of the first solution is from 1000 to 10000 (cp).

In a sixth aspect, a viscosity of the second solution is from 5 to 100 (cp).

In a seventh aspect, the first solution and the second solution each contain a resin precursor and a solvent.

In an eighth aspect, the resin precursor contained in at least one of the first solution or the second solution is polyamic acid.

In a ninth aspect, the resin precursor contained in the first solution and the resin precursor contained in the second solution are the same compound.

In a tenth aspect, the first and second solutions are applied by using a slit coater.

In an eleventh aspect, the application of the first solution is performed by mixed application of a base solution having a lower viscosity than the first solution and a thickener.

In a twelfth aspect, the slit coater includes a nozzle configured to discharge the base solution and a nozzle configured to discharge the thickener.

In a thirteenth aspect, the base solution and the thickener are mixed after being discharged from the nozzles.

In a fourteenth aspect, the base solution is a solution of the same composition as the second solution.

In a fifteenth aspect, a temperature of a cavity filled with a solution in the slit coater is made higher for the application of the second solution than for the application of the first solution.

In a sixteenth aspect, the first solution is applied to a support.

In a seventeenth aspect, an inorganic barrier layer is formed on the second resin film, and the TFT layer is formed on the inorganic barrier layer.

In an eighteenth aspect, the EL layer and a sealing layer are formed above the TFT layer, and the support is peeled after an upper face film is attached to the sealing layer.

In a nineteenth aspect, the support is peeled by irradiating the first resin film with a laser through the support.

In a twentieth aspect, the first resin film has tensile stress before the support is peeled.

In a twenty-first aspect, the base material has flexibility.

The EL device of a twenty-second aspect is an EL device including: a base material; and a TFT layer and an EL layer formed above the base material; wherein the base material includes a first resin film and a second resin film capable of being formed by curing an application liquid; and the first resin film is formed below the second resin film with a thickness equal to or greater than the thickness of the second resin film (for example, a thickness three or more times greater than the thickness of the second resin film).

In a twenty-third aspect, an inorganic base film is disposed between the first resin film and the second resin film.

In a twenty-fourth aspect, the first resin film has a thickness equal to or greater than the thickness of the second resin film (for example, a thickness three or more times greater than the thickness of the second resin film).

In a twenty-fifth aspect, the first resin film and the second resin film are made of the same material.

In a twenty-sixth aspect, the EL layer includes an organic EL layer.

The production apparatus for an EL device according to a twenty-seventh aspect is a production apparatus for an EL device including a base material, a TFT layer, and an EL layer; wherein the production apparatus forms at least a portion of the base material from a first resin film obtained by curing a first solution that is applied and a second resin film obtained by curing a second solution that is applied, and a viscosity of the first solution is made higher than a viscosity of the second solution.

The disclosure is not limited to each of the embodiments stated above, and embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 EL device
4 TFT layer
5 LED layer
6 Sealing layer
10 Lower face film
12 Base layer (base material)
12a First resin film
12b Second resin film
16 Inorganic insulating film
18 Inorganic insulating film
20 Inorganic insulating film
21 Organic interlayer film
24 EL layer
26 First inorganic sealing film
27 Organic sealing film
28 Second inorganic sealing film 50 Transparent support

The invention claimed is:

1. A production method for an EL device including a base material, a TFT layer, and an EL layer;
the production method comprising:
forming at least a portion of the base material from a first resin film obtained by curing a first solution applied and a second resin film obtained by curing a second solution applied,
wherein a viscosity of the first solution is made higher than a viscosity of the second solution,
the first solution and the second solution are applied by using a slit coater, and
the application of the first solution is performed by mixed application of a base solution having a lower viscosity than the first solution and a thickener.

2. The production method for an EL device according to claim 1,
wherein the slit coater comprises a nozzle configured to discharge the base solution and a nozzle configured to discharge the thickener.

3. The production method for an EL device according to claim 2,
wherein the base solution and the thickener are mixed after being discharged from the nozzles.

4. The production method for an EL device according claim 3,
wherein the base solution is a solution of the same composition as the second solution.

5. A production method for an EL device including a base material, a TFT layer, and an EL layer;
the production method comprising:
forming at least a portion of the base material from a first resin film obtained by curing a first solution applied and a second resin film obtained by curing a second solution applied,
wherein a viscosity of the first solution is made higher than a viscosity of the second solution,
the first solution and the second solution are applied by using a slit coater, and
a temperature of a cavity filled with a solution in the slit coater is made higher for the application of the second solution than for the application of the first solution.

6. The production method for an EL device according to claim 1, wherein the first solution is applied to a support.

7. The production method for an EL device according to claim 6,
wherein an inorganic barrier layer is formed on the second resin film, and the TFT layer is formed on the inorganic barrier layer.

8. The production method for an EL device according to claim 7,
wherein the EL layer and a sealing layer are formed above the TFT layer, and
the support is peeled after an upper face film is attached to the sealing layer.

9. The production method for an EL device according to claim 8,
wherein the support is peeled by irradiating the first resin film with a laser through the support.

10. The production method for an EL device according to claim 6,
wherein the first resin film has tensile stress before the support is peeled.

11. The production method for an EL device according to claim 1, wherein the base material has flexibility.

12. The production method for an EL device according to claim 1,
wherein the second solution is applied to the first resin film,
an inorganic base film is formed on the first resin film, and the second solution is applied to the inorganic base film.

13. The production method for an EL device according to claim 1,
wherein the first resin film has a thickness equal to or greater than a thickness of the second resin film.

14. The production method for an EL device according to claim 1,
wherein a viscosity of the first solution is from 1000 to 10000 cp.

15. The production method for an EL device according to claim 1,
wherein a viscosity of the second solution is from 5 to 100 cp.

16. The production method for an EL device according to claim 1,
wherein the first solution and the second solution each contain a resin precursor and a solvent.

17. The production method for an EL device according to claim 16,
wherein the resin precursor contained in at least one of the first solution or the second solution is polyamic acid.

18. The production method for an EL device according to claim 17,
wherein the resin precursor contained in the first solution and the resin precursor contained in the second solution are the same compound.

19. The production method for an EL device according to claim 5,
wherein the second solution is applied to the first resin film,
an inorganic base film is formed on the first resin film, and the second solution is applied to the inorganic base film.

20. The production method for an EL device according to claim 5,
wherein the first resin film has a thickness equal to or greater than a thickness of the second resin film.

* * * * *